United States Patent
Xue et al.

(10) Patent No.: US 9,214,419 B2
(45) Date of Patent: Dec. 15, 2015

(54) POWER SEMICONDUCTOR DEVICE AND PREPARATION METHOD THEREOF

(71) Applicants: Yan Xun Xue, Los Gatos, CA (US); Hamza Yilmaz, Saratoga, CA (US); Yueh-Se Ho, Sunnyvale, CA (US); Jun Lu, San Jose, CA (US)

(72) Inventors: Yan Xun Xue, Los Gatos, CA (US); Hamza Yilmaz, Saratoga, CA (US); Yueh-Se Ho, Sunnyvale, CA (US); Jun Lu, San Jose, CA (US)

(73) Assignee: ALPHA AND OMEGA SEMICONDUCTOR INCORPORATED, Sunnyvale, CA (US)

(*) Notice: Subject to any disclaimer, the term of this patent is extended or adjusted under 35 U.S.C. 154(b) by 10 days.

(21) Appl. No.: 14/194,502

(22) Filed: Feb. 28, 2014

(65) Prior Publication Data

US 2015/0249045 A1    Sep. 3, 2015

(51) Int. Cl.
  *H01L 21/44*   (2006.01)
  *H01L 23/495*  (2006.01)
  *H01L 21/78*   (2006.01)
  *H01L 23/29*   (2006.01)
  *H01L 23/48*   (2006.01)
  *H01L 23/52*   (2006.01)

(52) U.S. Cl.
  CPC .......... *H01L 23/49575* (2013.01); *H01L 21/78* (2013.01); *H01L 23/293* (2013.01); *H01L 23/4952* (2013.01); *H01L 23/49513* (2013.01); *H01L 23/49555* (2013.01)

(58) Field of Classification Search
  CPC ... H01L 21/44; H01L 21/78; H01L 23/49575; H01L 23/49513; H01L 23/4952; H01L 23/49555; H01L 23/49568
  USPC .......................................... 438/613; 257/737
  See application file for complete search history.

(56) References Cited

U.S. PATENT DOCUMENTS

| | | | |
|---|---|---|---|
| 6,930,397 B2 * | 8/2005 | Standing et al. | 257/782 |
| 2013/0037917 A1 * | 2/2013 | Xue | 257/621 |
| 2014/0264802 A1 * | 9/2014 | Yilmaz et al. | 257/676 |

* cited by examiner

*Primary Examiner* — Long K Tran
(74) *Attorney, Agent, or Firm* — Chein-Hwa S. Tsao; Chen-Chi Lin

(57) ABSTRACT

A preparation method for a power semiconductor device includes: providing a lead frame containing a plurality of chip mounting units, one side edge of a die paddle of each chip mounting unit is bent and extended upwardly and one lead connects to the bent side edge of the die paddle and extends in an opposite direction from the die paddle; attaching a semiconductor chip to the top surface of the die paddle; forming metal bumps on each electrode at the front of the semiconductor chip with a top end of each metal bump protruding out of a plane of the top surface of the lead; heating the metal bump and pressing a top end of each metal bump by a pressing plate forming a flat top end surface that is flush with the top surface of the lead; and cutting the lead frame to separate individual chip mounting units.

15 Claims, 7 Drawing Sheets

POWER SEMICONDUCTOR DEVICE AND PREPARATION METHOD THEREOF

FIELD OF PRESENT INVENTION

The present invention generally relates to a power device and a preparation method thereof, in particular, the invention aims at providing a power semiconductor device with a thin semiconductor chip and a preparation method thereof.

BACKGROUND OF RELATED ART

In a power device, the power consumption is ordinary. For an improvement on the electric performance and heat dissipation of the power device, the metal electrode of the device is partially exposed from a plastic package material covering a semiconductor chip. For example, US patent application US2003/0132531A1 shows a semiconductor packaging structure 24 including a semiconductor chip with exposed bottom electrode and being used for supporting surface mounting technology. As shown in FIG. 1, a power chip MOSFET (Metal-Oxide-Semiconductor Field Effect Transistor) 10 is arranged in an interior space of a metal can 12. A drain electrode at one side of MOSFET 10 is attached on the bottom of the metal can 12 in the interior space via a conductive silver paste 14 so that the drain electrode is electrically connected to a protruded edge 22 of the metal can 12; while a source electrode and a gate electrode at an opposite side of the MOSFET 10 are co-planar with the upper surface of the protruded edge 22. A low-stress and high-adhesive epoxy 16 is filled in a gap between the MOSFET 10 and the metal can 12. Although the heat dissipation issues have been solved for the packaging structure 24, it is expensive to produce such metal can 12. In addition, both the source electrode 18 and the gate electrode are fixed on the semiconductor chip 10, thus it is difficult to adjust the gate electrode and the source electrode 18 to be flush with the upper surface of the protruded edge 22 as such it is difficult to attach the power device 24 on a bonding pad on a PCB (Printed Circuit Board). Furthermore, the thickness of different semiconductor chips 10 will be varied and the above-mentioned problems are more troublesome.

BRIEF DESCRIPTIONS OF THE DRAWINGS

The embodiment of the present invention is more sufficiently described hereunder with reference to attached drawings. However, the attached drawings are only used for explaining and illustrating rather than limiting the range of the present invention.

FIG. 6A-1 to FIG. 6B-2 are schematic diagrams illustrating the process of FIGS. 2A-2E with an additional plastic packaging process.

FIGS. 7A-1 to 7D are schematic diagrams illustrating the replacement of the small metal bump of FIGS. 2A-2E by large metal bump.

FIG. 11A-1 to FIG. 11B-2 are schematic diagrams illustrating the process of FIGS. 7A-1 to 7D with an additional plastic packaging process.

DESCRIPTIONS OF THE SPECIFIC EMBODIMENTS

Figure 2A:
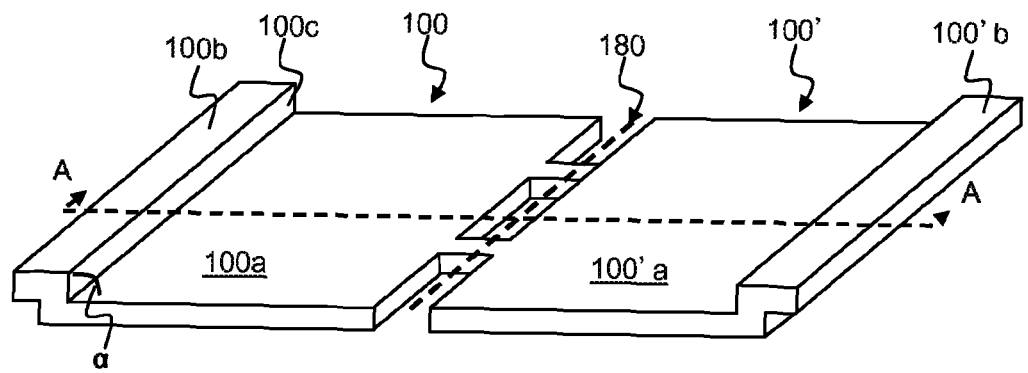
FIGS. 2A-2E are schematic diagrams illustrating a process of forming a flat top end surface by pressing the top end of a heated metal bump according to an embodiment of the present invention.

As shown in FIG. 2A, a pair of chip mounting units 100 and 100' are connected with each other via the connecting bars and are symmetry to each other along their symmetric cutting line 180 to form a mirror lead frame unit, where a lead frame (not shown) comprises a plurality of such mirror lead frame units. In addition to connecting bars, the chip mounting units 100 and 100' are also connected with each other via supporting bars of the lead frame (not shown). It should be noted that the mirror lead frame unit formed by the chip mounting units 100 and 100' is only an example for explanation. For example, the lead frame can comprise a plurality of only chip mounting units 100 (not shown). In FIG. 2A, the chip mounting unit 100 includes a square die paddle 100a located on the horizontal surface. One side edge of the die paddle 100a is bent and extended upwardly forming the side wing 100c and then horizontally extended out forming a lead 100b. An angle α between the side wing 100c and the die paddle 100a is a right angle or an obtuse angle preferably.

Figure 2B:
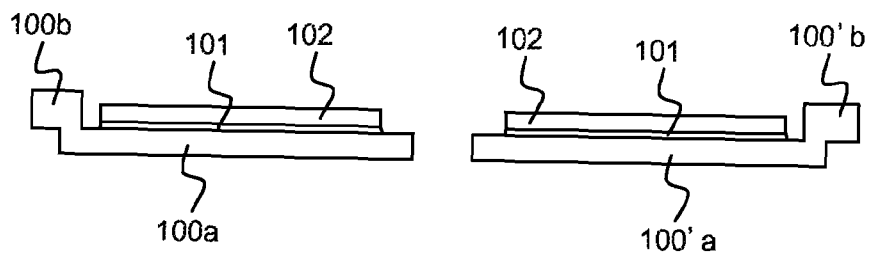
Figure 2C:
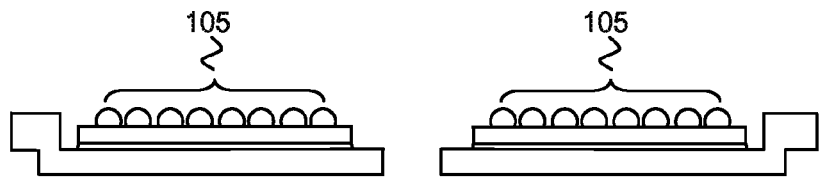
Figure 2D:
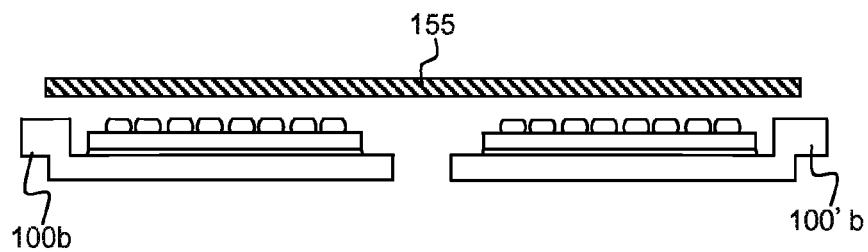

As shown in FIG. 2B, which is a cross-sectional diagram of the mirror lead frame unit of FIG. 2A along a dotted line AA in FIG. 2A, one semiconductor chip 102 is attached on the top surface of each die paddle 100a and 100'a via a conductive bonding material 101, which can be a conductive adhesive or a soldering paste or silver sintering and the likes. In one embodiment, the chip 102 is a vertical MOSFET, in which a bottom electrode arranged at the backside of the chip, such as a drain, is in electric connection with the die paddle 100a or 100'a and a gate electrode and a source electrode are arranged at the front side of the chip. As shown in FIG. 2C, a number of metal bumps 105, such as solder ball or other metal/alloy and the like, are deposited on each electrode at the front side of the chip 102, where only one metal bump 105 is deposited on the small area electrode, while a number of metal bumps 105 are deposited on the large area electrode, which is described in detail in following FIG. 7A-2. The height or the diameter of the metal bump 105 is reasonably selected, but the top end of each metal bump 105 must protrude out of the plane of the top surface of the leads 100b and 100'b. Then, as shown in FIG. 2D, the metal bump 105 is heated, for example, in a step of reflow soldering at a high temperature. Then a pressing plate 155 at an absolute horizontal position as shown in the figure is pressed on the top end of the not fully solidified metal bump 105, thus the top end of the metal bump 105 will be flattened. The pressing plate 155 is required not to attach to the metal bump 105. As such, the pressing plate 155 can be generally made of Teflon or marble and the likes, or the surface of the metal pressing plate 155 is coated with Teflon and other non-bonding materials.

When the pressing plate 155 is in contact with and pressed on the top surface of the metal bumps 105, it is obvious that the pressing plate 155 will be supported and stopped by the leads 100*b* and 100'*b* of the chip mounting units 100 and 100' so that the metal bumps 105 will not continue to be pressed below the top surface of the leads 100*b* and 100'*b*. As a result, the flat top surface of each metal bump 105 and the respective top surface of the leads 100*b* and 100'*b* are coplanar. In one embodiment of FIG. 2E, a non-conductive bonding agent 103 is coated on the top surface of the die paddles 100*a* and 100'*a* around the side edges of the chip 102 to firmly attach and secure the chip 102 on the top surface of the die paddles 100*a* and 100'*a*. Finally, the lead frame is singulated to cut off the connecting bar between two chip mounting units 100 or 100' to separate individual power semiconductor device 200A as shown in FIG. 2E.

Figure 2E:
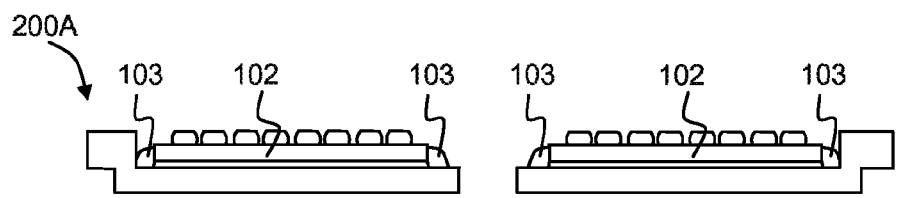
Figure 3A:
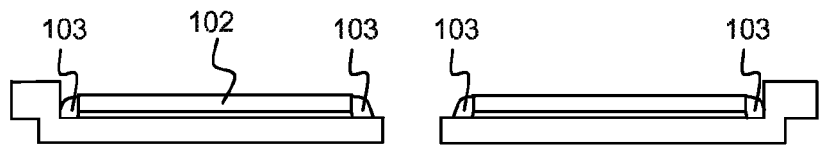
FIGS. 3A-3B are schematic diagrams illustrating the process of FIGS. 2A-2E but firstly coating a bonding agent and then planting the metal bump.
Figure 3B:
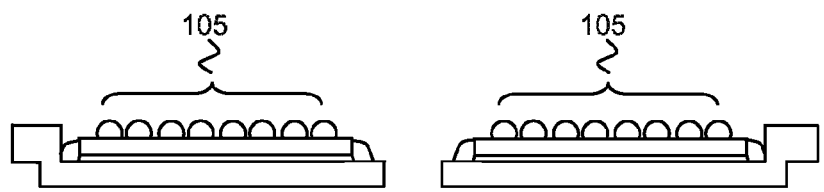

In the embodiment of FIGS. 3A-3B, the steps of this process are generally the same as the steps shown in FIGS. 2A-2E excepting that, after attaching the chip 102 on the die paddle and before placing the metal bump 105, the non-conductive bonding agent 103 is deposited on the top surface of the die paddle 100*a* or 100'*a* around the chip 102 to secure the chip 102 on the die paddle 100*a* or 100'*a*. The melting point of bonding material 101 is generally required to be higher than the melting point of the metal bump 105 to avoid the misplacement (by self-shifting or rotation) of the chip 102 on the top surface of the die paddles 100*a* and 100'*a* during the heating step of the metal bump 105. However, if the chip 102 is secured on the die paddles 100*a* and 100'*a* by the bonding agent 103 before heating the metal bump 105, the melting point difference between the bonding material 101 and the metal bump 105 is not required. Further, in other embodiments (not shown), the non-conductive bonding agent 103 can also be coated on the top surface of the die paddles 100*a* and 100'*a* around the chip 102 after placing the metal bump 105 but before heating and pressing the top end of the metal bump 105, i.e., the bonding agent 103 is also formed between the step of FIG. 2C and step of FIG. 2D.

Figure 4A:
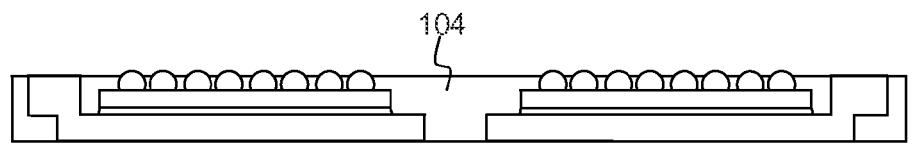
FIGS. 4A-4D are schematic diagrams illustrating a process of grinding the top end of the metal bump to form the flat top end surface after placing the metal bump according to an embodiment of the present invention.
Figure 4B:
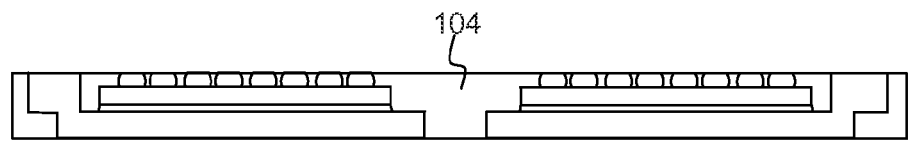
Figure 4C:
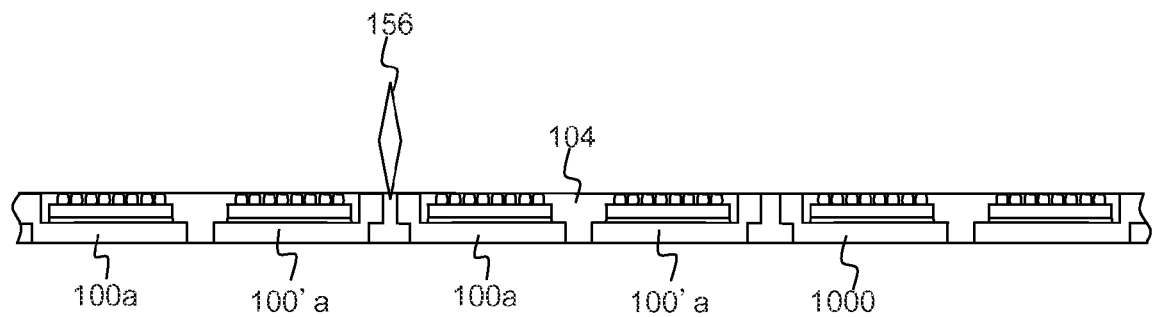
Figure 4D:
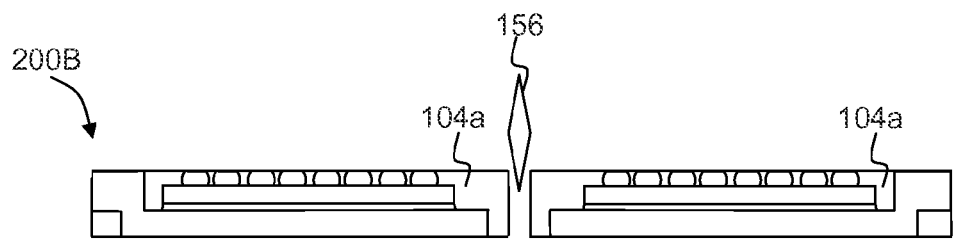

In another embodiment, FIGS. 4A-4D illustrate the subsequent steps following the step of FIG. 2C, which replace the step of FIGS. 2D-2E in the above embodiment. As shown in FIG. 4A, a plastic packaging layer 104 is formed, for example by the plastic packaging material like epoxy resin, to cover the lead frame, mainly covering the chip mounting units 100 and 100' as well as the chip 102 and the metal bump 105 with the bottom surface of the die paddles 100*a* and 100'*a* exposing out of the bottom surface of the plastic packaging layer 104. In this embodiment, the top surface of the plastic packaging layer 104 is flush with the top surface of the leads 100*b* and 100'*b*, so that the top end of the metal bump 105 is exposed out of the top surface of the plastic packaging layer. In FIG. 4B, the top portion of the metal bump 105 protruding out of the top surface of the leads 100*b* and 100'*b* is polished forming the flat top end surface of the metal bump 105 that are coplanar with the top surface of the plastic packaging layer 104 and the top surfaces of the leads 100*b* and 100'*b*. In FIG. 4C, the lead frame 1000 includes a plurality of the mirror lead frame units 100 with the chips 102 and the metal bumps 105 attached thereon. The lead frame 1000 and the plastic packaging layer 104 are cut with a cutter 156 at the locations between two adjacent chip mounting units 100 or 100'. At this time, the connecting bar connected between two chip mounting units 100 or 100' is cut off, and thus the plastic packaging layer 104 is also cut to form a plurality of plastic packaging bodies 104*a*, forming individual power semiconductor devices 200B as shown in FIG. 4D. In the device 200B, the chip mounting unit 100 or 100', the chip 102 and the metal bump 105 are covered by the plastic body 104*a*, where the flat top end surface of each of the metal bumps 105 is coplanar with the top surface of the leads 100*b* and 100'*b* and the top surface of the plastic packaging body 104, so that the top end surface of the metal bump 105 and the top surface of the leads 100*b* and 100'*b* are all exposed from the top surface of the plastic packaging body 104 as the contact terminals to perform butt welding to a bonding pad on the device and the PCB, while the bottom surface of the die paddles 100*a* and 100'*a* can be exposed out of the bottom surface of the plastic packaging body 104*a* to dissipate the heat produced by the chip 102.

Alternatively, the steps of FIGS. 4A-4D may be slightly changed with forming a thicker plastic packaging layer 104 in FIG. 4A that fully covers the top surface of each metal bump 105 as well as the leads 100*b* and 100'*b*. In this case, the top surface of the plastic packaging layer 104 is ground until gradually exposing the metal bumps 105 and the leads 100*b* and 100'*b* from the plastic packaging layer 104 with the top end surface of the metal bumps 105 being coplanar with the top surface of the leads 100*b* and 100'*b* and the top surface of the thinned plastic packaging layer 104. At this time, the top surface of the leads 100*b* and 100'*b* and the top end surface of the metal bump 105 are exposed out of the thinned plastic packaging layer 104.

Figure 5A:
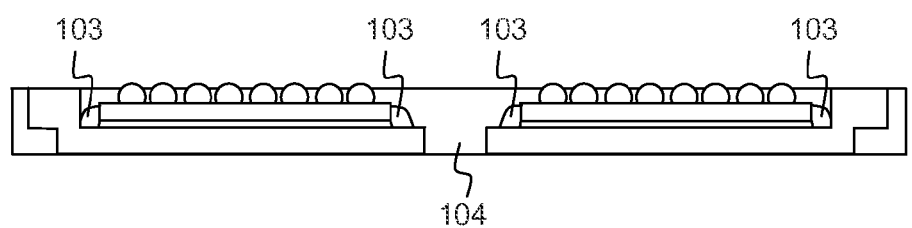
FIGS. 5A-5B are schematic diagrams illustrating the process of FIGS. 4A-4D with an additional step of coating the bonding agent.
Figure 5B:
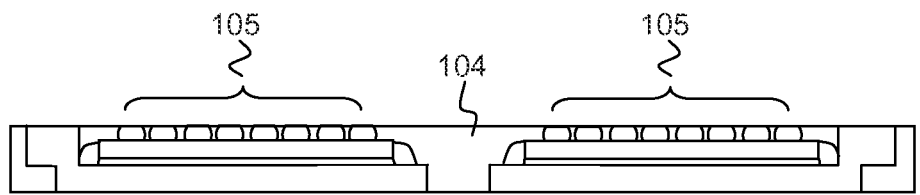

In the embodiment in FIGS. 5A-5B, the process is generally the same as that shown in FIGS. 4A-4D excepting that, before forming the plastic packaging layer 104, the non-conductive bonding agent 103 is coated on the top surface of the die paddles 100*a* and 100'*a* around the chip 102 for securing the chip 102 on the die paddle 100*a* or 100'*a*. The non-conductive bonding agent 103 can be formed before or after placing the metal bumps 105. As such, in the final power semiconductor device, for example power semiconductor device 200B in FIG. 4D, the subsequently formed plastic packaging body 104 further covers the bonding agent 103.

Figure 1:
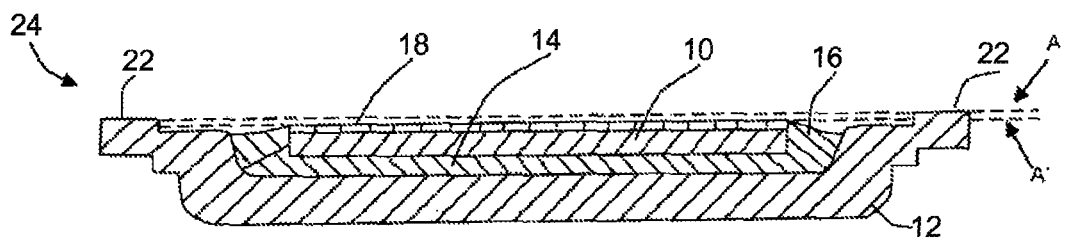
FIG. 1 is a schematic sectional diagram of a semiconductor packaging structure in background art.
Figures 1, 6A:
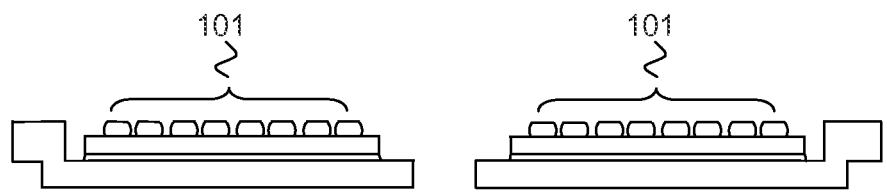
Figures 2, 6A:
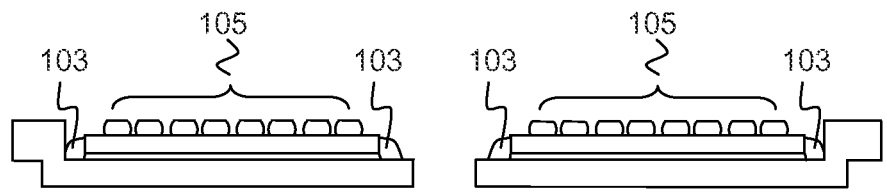
Figures 1, 6B:
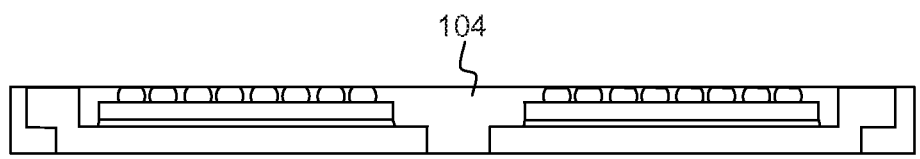
Figures 2, 6B:
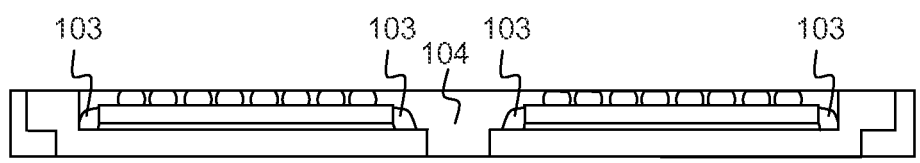

FIG. 6A-1 is similar to FIG. 2D, and FIG. 6A-2 is similar to FIG. 2E. In FIG. 6B-1, the top surface of the plastic packaging layer 104 is flush with the top surface of the leads 100*b* and 100'*b*. The top end surface of the metal bump 105 is required to be exposed out of the top surface of the plastic packaging layer 104. However, the top end of the metal bump 105 is pressed flatly before the plastic packaging process, so that part of the plastic packaging material that is not solidified in the plastic packaging process is easily entering into the gap between the top end surface of the metal bump 105 and the top wall of the mold cavity, thus the top end surface of the metal bumps 105 is covered by a thin layer of plastic packaging material. Therefore, in the steps of FIG. 6B-1, the plastic packaging layer 104 is slightly ground from the top surface to expose the top surfaces of the leads 100*b* and 100'*b* as well as the top end surface of the metal pump 105 from the top surface of the plastic packaging layer 104. The process of FIG. 6B-2 is similar as the process of FIG. 6B-1 excepting that the bonding agent 103 is formed on the top surface of the die paddle 100*a* and 100'*a* around the side edges of the chip 102. As mentioned above in FIG. 2E, the bonding agent 103 can be formed before or after placing the metal bumps 105 but before heating and pressing the top end of each metal bump 105. This method has been described in the above embodiments.

Figures 1, 7A:
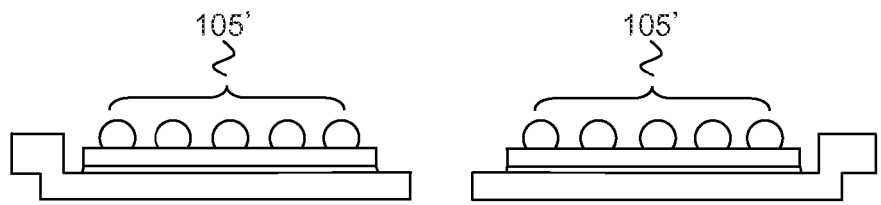
Figures 2, 7A:
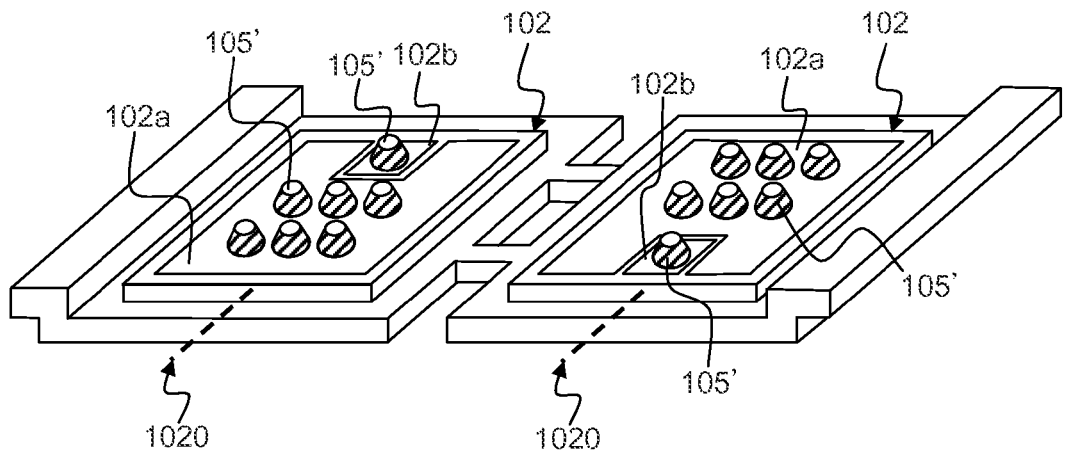
Figure 7B:
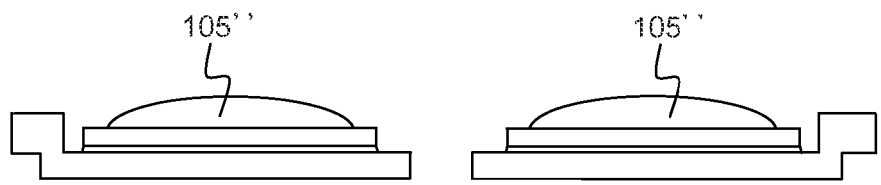
Figure 7C:
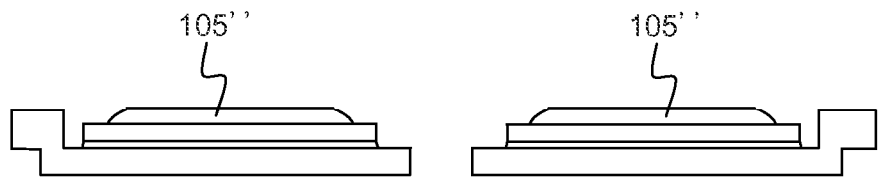
Figure 7D:
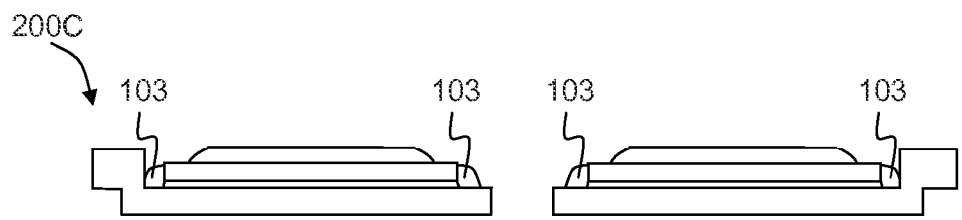

In another embodiment, the process of FIG. 7A-1 to FIG. 7D are similar as the process of FIG. 2A-2E excepting that the volume or the diameter of the metal bump 105' in FIG. 7A-1 is bigger than that of the metal bump 105 in FIG. 2C. In FIG.

7A-2, the contact area of the source electrode 102a at the front of the chip 102 is much larger than that of the gate electrode 102b, so that a plurality of metal bumps 105' are formed on the source electrode 102a, while only a few or even only one metal bumps 105' is formed on the gate electrode 102b. The benefits of larger metal bump 105' are that when these metal bumps 105' on the source electrode 102a are closer to each other, they can merge together under the molten state to form a larger metal bump 105" as shown in FIG. 7B, which can carry a greater current flowing through the source electrode 102a. At the same time, only one metal bump 105' is formed on the gate electrode 102b. It is clear that the volume of the metal bump 105" is much greater than the volume of the metal bump 105'. Further, in the above embodiments, for example in FIG. 2C, if the density of the metal bump 105 on the source electrode 102a is increased, they can merge together to form a larger metal bumps 105". The subsequent steps in FIGS. 7C-7D are corresponding to the steps of FIGS. 2C-2E: in FIG. 7C, the metal bump 105" on the source electrode 102a and the metal bump 105' on the gate electrode 102b is pressed to form flat top end surfaces; in FIG. 7D, the bonding agent 103 is deposited on the top surface of the die paddle 100a or 100'a around the side edge of the chip 102, and finally the lead frame is cut to separate the individual power semiconductor device 200C.

In FIG. 7A-2 the chip mounting units 100 and 100' are mirror symmetry, therefore it is necessary to make some adjustments on the orientation of a chip 102 attached on the die paddle 100a of the chip mounting unit 100 and another chip 102 attached on the die paddle 100'a of the chip mounting unit 100' in order to ensure the final power semiconductor devices are fully consistent in structure after subsequently implementing the cutting step of the lead frame or the plastic packaging layer. As shown in FIG. 7A-2, gate electrode 102b and source electrode 102a at the front of the chips 102 are substantially located on a symmetric center line 1020 of each chip 102 but in two opposite sides with the source electrode 102a occupying the most area at the front of the chip 102. The symmetric center line 1020 of the chip 102 on the die paddle 100a or 100'a must be parallel with side wing 100c. Specifically, the chip 102 attached on the die paddle 100'a rotates 180 degrees relative to the chip 102 attached on the die paddle 100a substantially. For example, as shown in FIG. 7A-2, when the chip mounting units 100 and 100', with the chip 102 attached on the die paddle 100a or 100'a, are separated from the lead frame, if the chip mounting unit 100 is set in a fixed position and the chip mounting unit 100' rotates 180 degrees, they are completely the same. Although not shown in the figure, it is well known in the art that each of electrodes at the front of the chip 102 is electrically insulated from each other by a passivation layer.

Figure 8A:
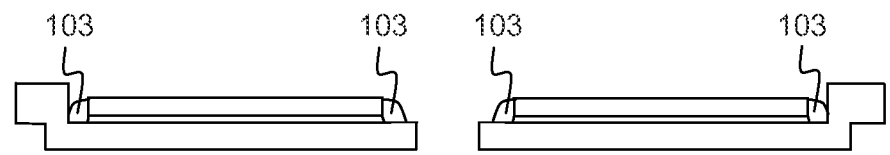
FIGS. 8A-8B are schematic diagrams illustrating the process of FIGS. 7A-1 to 7D with firstly coating the bonding agent and then placing the metal bump.
Figure 8B:
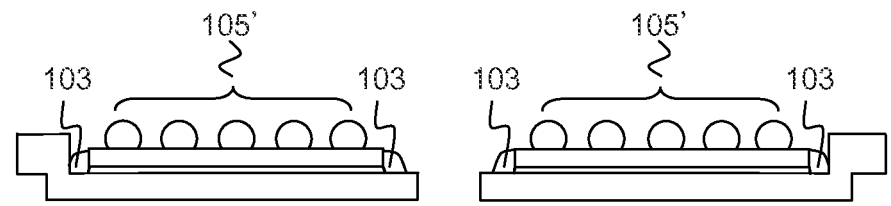

FIGS. 8A-8B are based on the process flow of FIGS. 7A-1 to 7D, excepting that the non-conductive bonding agent 103 is formed on the top surface of the die paddle 100a and 100'a around the chip 102 to secure the chip 102 after attaching the chip 102 on the die paddle 100a and 100'a and before placing the metal bump 105' on the chip 102. In other embodiments (not shown), the non-conductive bonding agent 103 is coated on the top surface of the 100a and 100'a around the chip 102 after placing the metal bump 105' on the chip 102 and before heating the metal pump 105' to form the larger metal bump 105", in other words before pressing the top end of the metal bump 105' and the metal bump 105" and after placing the metal bump 105' on the gate and source, i.e. the non-conductive bonding agent 103 is formed between the steps of FIG. 7A-2 and FIG. 7B.

Figure 9A:
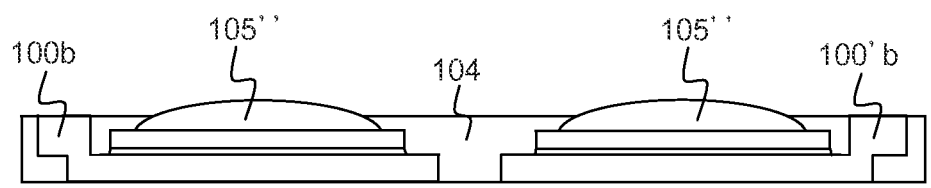
FIGS. 9A-9B are schematic diagrams illustrating a process of grinding the top end of the metal bump to form the flat top end surface after placing the large metal bump
Figure 9B:
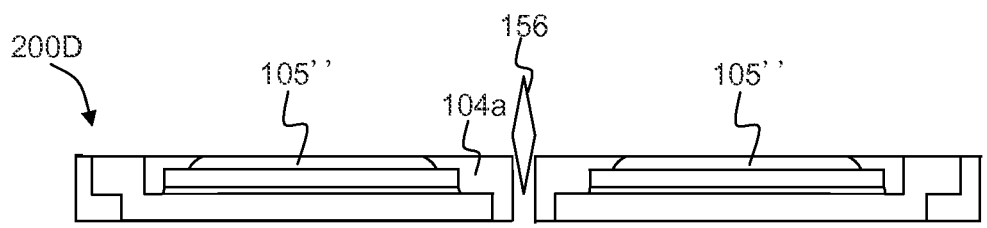

The embodiment of FIGS. 9A-9B illustrates the subsequent steps following FIG. 7B. As shown in FIG. 9A, a plastic packaging layer 104 is formed to cover the lead frame, mainly covering the chip mounting unit 100 and 100' as well as the chip 102 and the metal bumps 105' and 105" with the bottom surface of the die paddles 100a and 100'a exposing out of the bottom surface of the plastic packaging layer 104. As shown in FIG. 9A, the top surface of the plastic packaging layer 104 is flush with the top surface of the leads 100b and 100'b, so that the top end of the metal bump 105' on the gate electrode 102b and the metal bump 105" on the source electrode 102a is protruded out from the top surface of the plastic packaging layer 104 and the leads 100b and 100'b. As shown in FIG. 9B, the protruded part of the metal bumps 105' and 105" are polished to form the flat top end surface of the metal bumps 105' and 105" that is coplanar with the top surface of the plastic packaging layer 104 and the top surfaces of the leads 100b and 100'b. Then, the lead frame and the plastic packaging layer 104 are cut to separate the individual power semiconductor device 200D as shown in FIG. 9B. In the power semiconductor device 200D, exposed top end surfaces of the metal bump 105' arranged on the gate electrode 102b and the metal bump 105" arranged on the source electrode 102a after the polishing step are larger than that before the polishing step.

Figure 10A:
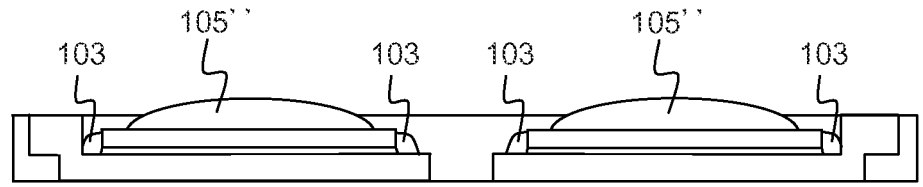
FIGS. 10A-10B are schematic diagrams illustrating the process of FIGS. 9A-9B with an additional step of coating the bonding agent.
Figure 10B:
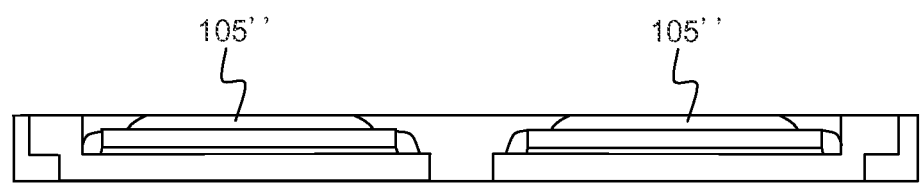

In another embodiment, the steps of FIGS. 9A-9B may be slightly changed by forming a thicker plastic packaging layer 104 in FIG. 9A. In this case, the plastic packaging layer 104 fully covers the metal bumps 105' and 105" and the leads 100b and 100'b. The top surface of the plastic packaging layer 104 is then ground until the top surfaces of the metal bumps 105' and 105" and the leads 100b and 100'b exposing out of the thinned plastic packaging layer 104 with the top surfaces of the metal bumps 105' and 105", the leads 100b and 100'b and the plastic packaging layer 104 being coplanar. In the embodiment in FIGS. 10A-10B, the process are similar as the process in FIGS. 9A-9B excepting that the non-conductive bonding agent 103 is coated on the top surface of the die paddle 100a and 100'a around the chip 102 to secure the chip 102 on the die paddle 100a or 100'a before forming the plastic packaging layer 104. Alternatively, the non-conductive bonding agent 103 can be formed before or after placing the metal bumps 105' on the gate and the source electrodes but before heating the metal bumps 105' to form the metal bump 105". In this case, the plastic packaging body 104a also covers the bonding agent 103 in the final power semiconductor device (not shown).

Figures 1, 11A:
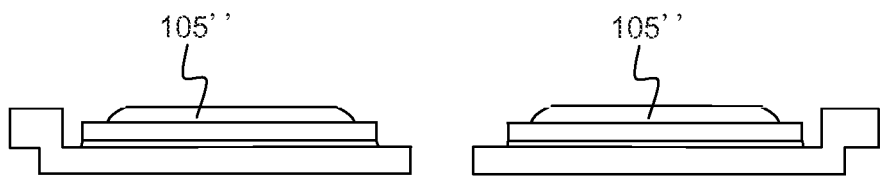
Figures 2, 11A:
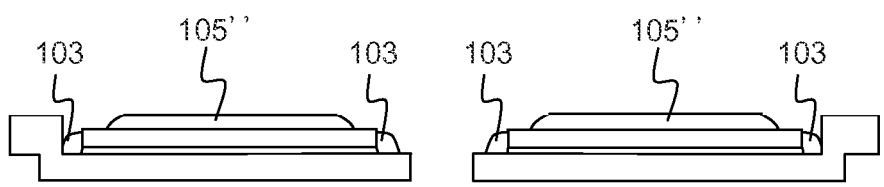
Figures 1, 11B:
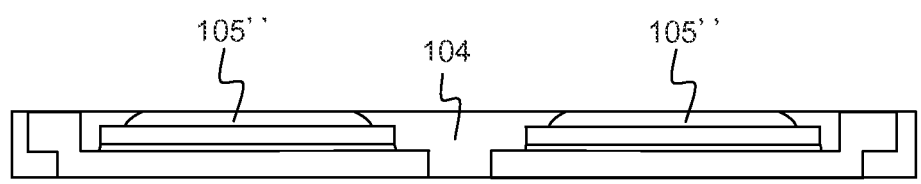
Figures 2, 11B:
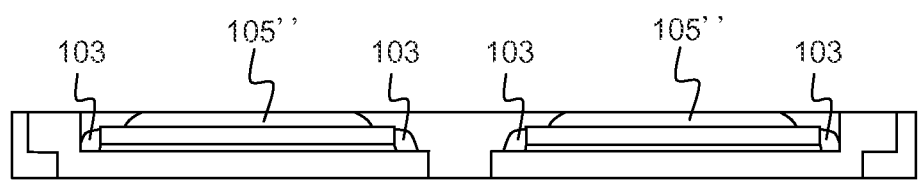

FIG. 11A-1 is similar as FIG. 7C and FIG. 11A-2 is similar as FIG. 7D. In FIG. 11B-1, a packaging layer 104 is formed on the structure shown in FIG. 11A-1 with the top surface of the plastic packaging layer 104 is flush with the top surface of the leads 100b and 100'b. The top end surface of the metal bumps 105' and 105" is required to expose out of the top surface of the plastic packaging layer 104. However, the top end of the metal bumps 105' and 105" is pressed flatly before the plastic packaging process, so that part of the plastic packaging material that is not solidified in the plastic packaging process is easily entering into the gap between the top end surface of the metal bumps 105' and 105" and the top wall of the mold cavity, as such the top end surfaces of the metal bumps 105' and 105" are covered by a thin layer of plastic packaging material. Therefore, in the steps of FIG. 11B-1, the top surface of the plastic packaging layer 104 is slightly ground to fully expose the top surfaces of the leads 100b and 100'b and the top end surface of the metal pumps 105' and 105" from the top surface of the plastic packaging layer 104. Similarly, in FIG. 11B-2, a packaging layer 104 is formed on the structure shown in FIG. 11A-2 with the top surface of the plastic packaging layer 104 is flush with the top surface of the leads 100*b* and 100'*b*, then the top surface of the plastic packaging layer 104 is slightly ground to fully expose the top surfaces of the metal pumps 105' and 105" from the top surface of the plastic packaging layer 104. As mentioned above, the bonding agent 103 in FIG. 11B-2 is formed after attaching the chip 102 on the die paddle 100*a* or 100'*a*, where the bonding agent 103 can be formed before or after placing the metal bumps 105' on the gate and the source electrodes but before heating the metal bumps 105' to form the metal bump 105" on the source electrode.

Above of all, the typical embodiment in a specific structure of the descriptions of the preferred embodiments is given through descriptions and drawings. The above invention proposes the better existing embodiment, but these contents are not used as limit. For those skilled in the art, various modifications and variations are undoubtedly obvious after reading the above-mentioned specification. Consequently, the claims appended hereto should be regarded as all variations and modifications covering the real intention and the scope of the present invention. In the scope of the claims, any and all equivalent scopes and contents should be considered still belonging to the intension and the scope of the present invention.

What is claimed is:

1. A preparation method of a power semiconductor device, the preparation method comprising the steps of:
   providing a lead frame containing a plurality of chip mounting units, wherein one side edge of a die paddle of each chip mounting unit is bent and extended upwardly and one lead connects to the bent side edge of the die paddle and is horizontally extended out in an opposite direction from the die paddle;
   attaching a semiconductor chip to a top surface of the die paddle;
   forming metal bumps on each electrode at a front of the semiconductor chip with a top end of each metal bump protruding out of a plane of a top surface of the lead;
   heating the metal bump and pressing the top end of each metal bump by a pressing plate forming a flat top end surface that is coplanar with the top surface of the lead; and
   cutting the lead frame to separate individual chip mounting units.

2. The method of claim 1, wherein a non-conductive bonding agent is coated on the top surface of the die paddle around the semiconductor chip.

3. The method of claim 2, wherein a non-conductive bonding agent is coated on the top surface of the die paddle around the semiconductor chip after heating and pressing the top end of each metal bump.

4. The method of claim 2, wherein a non-conductive bonding agent is coated on the top surface of the die paddle around the semiconductor chip after attaching the semiconductor chip on the die paddle and before forming the metal bump on each electrode at the front of the semiconductor chip.

5. The method of claim 2, wherein the non-conductive bonding agent is coated on the top surface of the die paddle around the semiconductor chip after forming the metal bump on each electrode at the front of the semiconductor chip and before heating and pressing the top end of each metal bump.

6. The method of claim 2, before cutting the lead frame, further comprising forming a plastic packaging layer to cover each chip mounting unit, the semiconductor chip, the metal bump and the bonding agent with a bottom surface of the die paddle exposing out of a bottom surface of the plastic packaging layer and the top end surface of the metal bump and the top surface of the lead exposing out of a top surface of the plastic packaging layer; and
   the step of cutting the lead frame comprising cutting off portion of the lead frame and the plastic packaging layer between adjacent chip mounting units.

7. The method of claim 1, before cutting the lead frame, further comprising forming a plastic packaging layer to cover each chip mounting unit, the semiconductor chip and the metal bump with a bottom surface of the die paddle exposing out of a bottom surface of the plastic packaging layer and the top end surface of the metal bump and the top surface of the lead exposing out of a top surface of the plastic packaging layer; and
   the step of cutting the lead frame comprising cutting off portions of the lead frame and the plastic packaging layer between adjacent chip mounting units.

8. The method of claim 1, wherein the step of forming metal bumps on each electrode at the front of the semiconductor chip comprises forming a plurality of metal bumps adjacent to each other on at least one electrode at the front of the chip;
   and wherein in the step of heating the metal bump, the plurality of adjacent metal bumps is melted and merged together to form a larger metal bump.

9. A preparation method of a power semiconductor device, the preparation method comprising the steps of:
   providing a lead frame containing a plurality of chip mounting units, wherein one side edge of a die paddle of each chip mounting unit is bent and extended upwardly and one lead connects to the bent side edge of the die paddle and is horizontally extended out in an opposite direction from the die paddle;
   attaching a semiconductor chip on a top surface of the die paddle;
   forming metal bumps on each electrode at a front of the semiconductor chip with a top end of each metal bump protruding out of a plane of a top surface of the lead;
   forming a plastic packaging layer to cover each chip mounting unit, the semiconductor chip and metal bumps with a bottom surface of the die paddle exposing out of a bottom surface of the plastic packaging layer;
   grinding the protruded portion of each metal bump forming a flat top end surface of each metal bump that is coplanar with the top surface of the lead; and
   cutting portions of the lead frame and the plastic packaging layer between adjacent chip mounting units to separate individual chip mounting units.

10. The method of claim 9, wherein in the step of forming the plastic packaging layer, a top surface of the plastic packaging layer is coplanar with the top surface of the lead, and wherein the top end of the metal bump protrudes out of the top surface of the plastic packaging layer and the top surface of the lead and is exposed out of the top surface of the plastic packaging layer.

11. The method of claim 9, wherein in the step of forming the plastic packaging layer, the top surfaces of the lead and each metal bump are covered by the plastic packaging layer; and
   wherein the step of grinding the metal bump to form the flat top end surface comprises:
   grinding to thin the plastic packaging layer from a top surface of the plastic packaging layer until the metal bump is exposed, wherein the protruded portion of each metal bump from the top surface of the lead is ground and the top surface of the lead is exposed out of the top surface of the thinned plastic packaging layer.

12. The method of claim 9, wherein a non-conductive bonding agent is coated on the top surface of the die paddle around the semiconductor chip before forming the metal bump on each electrode at the front of the semiconductor chip.

13. The method of claim 9, wherein a non-conductive bonding agent is coated on the top surface of the die paddle around the chip after forming the metal bump on each electrode at the front of the semiconductor chip and before forming the plastic packaging layer.

14. The method of claim 9, wherein forming metal bumps on each electrode at the front of the semiconductor chip comprises forming a plurality of metal bumps adjacent to each other on at least one electrode at the front of the chip, and wherein the adjacent metal bumps are heated before forming the plastic packaging layer so that the plurality of adjacent metal bumps are melted and merged together to form a larger metal bump.

15. The method of claim 14, wherein a non-conductive bonding agent is coated on the die paddle around the chip after forming the metal bump on each electrode at the front of the semiconductor chip and before forming the larger metal bump.

* * * * *